United States Patent
Murakami et al.

(10) Patent No.: US 6,501,101 B2
(45) Date of Patent: Dec. 31, 2002

(54) LIGHT EMITTING DIODE

(75) Inventors: Tetsurou Murakami, Tenri (JP);
Takahisa Kurahashi, Kashiba (JP);
Shouichi Ohyama, Ikoma-gun (JP);
Hiroshi Nakatsu, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/883,367

(22) Filed: Jun. 19, 2001

(65) Prior Publication Data

US 2002/0050590 A1 May 2, 2002

(30) Foreign Application Priority Data

Sep. 4, 2000 (JP) .................................... 2000-267086
Apr. 24, 2001 (JP) .................................... 2001-126110

(51) Int. Cl.⁷ ............................................. H01L 31/12
(52) U.S. Cl. ............................ 257/79; 257/13; 257/103
(58) Field of Search ........................... 257/79–103, 25, 257/13, 918; 438/22, 24, 25, 28, 29, 46, 47

(56) References Cited

U.S. PATENT DOCUMENTS

| 5,410,159 A | * | 4/1995 | Sugawara et al. | ............ 257/13 |
| 5,925,896 A | * | 7/1999 | Dutta | ......................... 257/103 |
| 2001/0020703 A1 | * | 9/2001 | Gardner et al. | ................ 257/87 |
| 2002/0008245 A1 | * | 1/2002 | Goetz et al. | ................... 257/87 |

FOREIGN PATENT DOCUMENTS

JP 6-112528 4/1994

* cited by examiner

Primary Examiner—David Nelms
Assistant Examiner—Long Tran
(74) Attorney, Agent, or Firm—Nixon & Vanderhye P.C.

(57) ABSTRACT

A light emitting diode comprising a multiple quantum well (MQW) layer as an active layer and a reflecting layer below the active layer, wherein the number and/or total thickness of well layers in the MQW layer is determined such that the MQW layer shows an external quantum efficiency higher than that of an MQW layer including a single well layer.

23 Claims, 5 Drawing Sheets

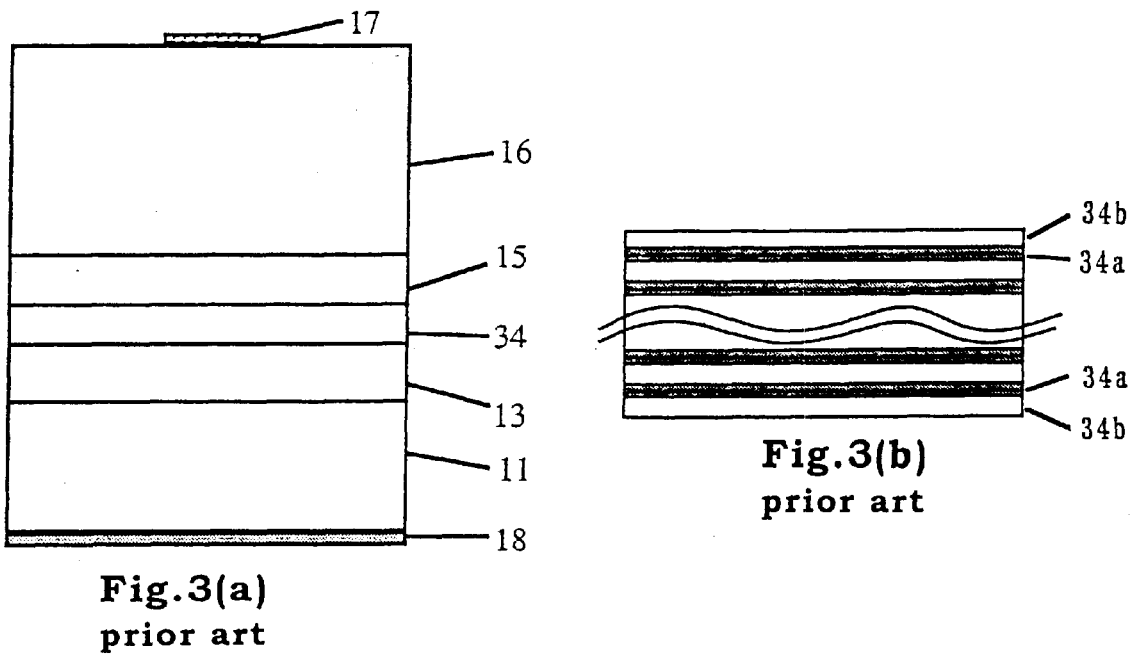
Fig.3(a)
prior art
Fig.3(b)
prior art
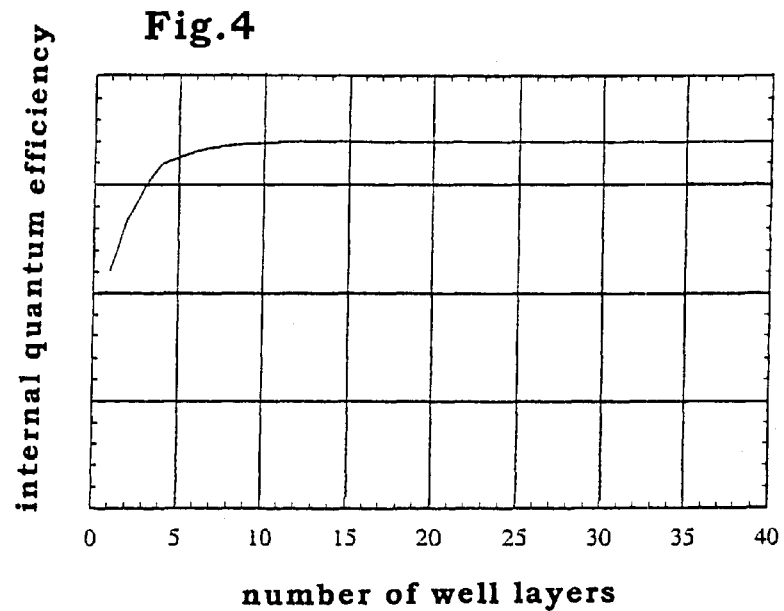
number of well layers

LIGHT EMITTING DIODE

CROSS-REFERENCES TO RELATED APPLICATIONS

This application is related to Japanese applications Nos. 2000-267086 and 2001-126110, filed on Sep. 4, 2000 and Apr. 24, 2001 whose priorities are claimed under 35 USC § 119, the disclosures of which are incorporated by reference in their entirety.

BACKGROUND OF THE INVENTION

1. Field of the Invention

The present invention relates to an improvement in output of a light emitting diode (LED) comprising a multiple quantum well (MQW) layer and a reflecting layer below the MQW layer. In particular, it relates to an LED comprising an MQW layer made of an AlGaInP type material and a distribution type Bragg reflection (DBR) layer as a reflecting layer.

2. Description of Related Art

A Semiconductor device utilizing an AlGaInP type semiconductor material has been employed as a visible light emitting device, since the material is capable of lattice coupling with a GaAs substrate and shows the greatest direct transitional bandgap among III–V group compound semiconductors. As a light emitting diode, the semiconductor device performs direct transitional light emission in the range of 550 to 690 nm, which exhibits a high light emitting efficiency.

The device employs, as an active layer, a multiple quantum well (MQW) layer capable of showing higher light emitting efficiency than a bulk active layer. Higher output is obtained by increasing the number of well layers comprising the MQW layer. It is considered desirable that the number of the well layers is 10 or more (see Japanese Unexamined Patent Publication No. HEI 6(1994)-112528).

FIG. 3(a) shows an example of a conventional light emitting diode made of AlGaInP. In FIG. 3(a), reference numeral 11 signifies an n-type GaAs substrate, on which an n-type AlGaInP clad layer 13, a MQW layer (active layer) 34 of AlGaInP type material, a p-type AlGaInP clad layer 15, a p-type GaInP electric current diffusion layer 16 are formed. Further, electrodes 17 and 18 are formed on a p-side and an n-side, respectively to complete the light emitting diode. As shown in FIG. 3(b), the MQW active layer is comprised of ten or more AlGaInP type well layers 34a and ten or more barrier layers 34b that are alternately stacked.

To improve output of the conventional LED, it may be a possible manner to form a reflecting layer below the active layer to reflect and take out light emitted toward the substrate. According to the construction, light which has been absorbed in the substrate can be extracted. Therefore, it is considered that the output will be doubled if a reflectance of the reflecting layer is 100%.

Actually, an AlGaAs type reflecting layer of a DBR structure shows the reflectance of 95% by itself. However, even if the reflecting layer is applied to the LED, improvement of the output is less than 95% because the active layer absorbs light reflected on the reflecting layer when it passes through the active layer. Where the light absorption of the active layer is remarkable, the reflecting layer becomes ineffective.

SUMMARY OF THE INVENTION

An object of the present invention is to improve output by optimizing a layered structure of the MQW active layer to suppress the absorption of the reflected light by the active layer.

According to the present invention, in an LED comprising an MQW layer and a reflecting layer below the MQW layer, higher output is obtained by optimizing the structure of the MQW layer to suppress the absorption of the reflected light.

Thus, the present invention provides a light emitting diode comprising an MQW layer as an active layer and a reflecting layer below the active layer, wherein the number of well layers in the MQW layer is determined such that the MQW layer shows an external quantum efficiency higher than that of an MQW layer including a single well layer.

The present invention further provides a light emitting diode comprising an MQW layer as an active layer and a reflecting layer below the active layer, wherein a total thickness of well layers in the MQW layer is determined such that the MQW layer shows an external quantum efficiency to the maximum.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3(a) and 3(b) are schematic sectional views for illustrating a conventional LED;

FIG. 4 is a graph for illustrating a relationship between the number of well layers and internal quantum efficiency;

DESCRIPTION OF THE PREFERRED EMBODIMENTS

One of the features of the present invention is to determine the number of the well layers in the MQW layer such that the MQW layer shows an external quantum efficiency higher than that of an MQW layer including a single well layer. Light emitting efficiency of the active layer is improved by setting the number of the well layers greater than 1. Further, reflected light is efficiently extracted by limiting the number of the well layers not to be excess, which improves the external quantum efficiency.

For example, for forming a red light emitting diode with a GaInP well layer of 80 Å thick, the number of the well layers is preferably 2 to 30 to obtain the external quantum efficiency higher than the case where a single well layer is provided. The number greater than 30 is not preferable since the external quantum efficiency becomes lower than the case where a single well layer is provided. Even if the light emitting efficiency of the active layer improves, reflected light is almost absorbed in the active layer with the increased number of the well layers.

Merely in view of improvement of the light emitting efficiency of the active layer, the number of the well layers is desirably 10 or more. However, where a reflecting layer is provided, attention must be paid on the active layer absorbing light reflected on the reflecting layer. Since the light emitting layer of the LED also serves as an absorption layer to the emitted light, light absorption rate increases as the number of the well layers increases. Accordingly, the external quantum efficiency of the LED can be enhanced by increasing the light emitting efficiency of the active layer to some extent and reducing the light absorption rate of the active layer to some extent.

Figure 5:
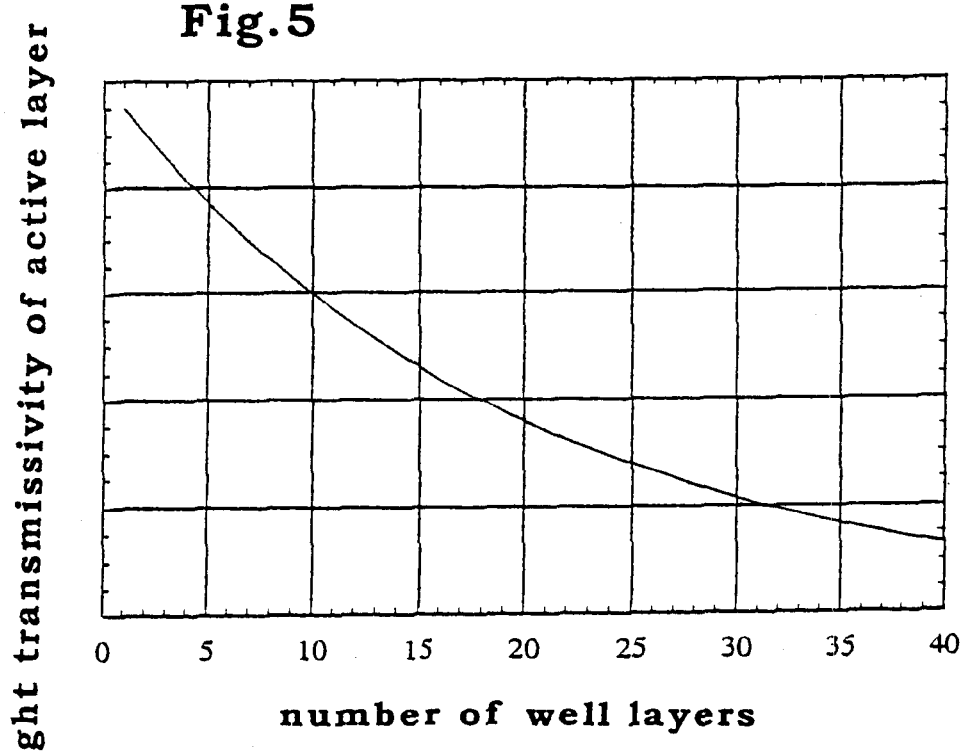
FIG. 5 is a graph for illustrating a relationship between the number of the well layers and light transmissivity of the active layer.

FIG. 4 illustrates a relationship between the number of the well layers and the light emitting efficiency. According to FIG. 4, the light emitting efficiency rises as the number of the well layers increases. Further, FIG. 5 illustrates a relationship between the number of the well layers and transmissivity of the reflected light. FIG. 5 shows that the transmissivity increases as the number of the well layers decreases. The values may vary depending on thicknesses and compositions of the well layer and the barrier layer, but similar tendencies are observed.

Figure 6:
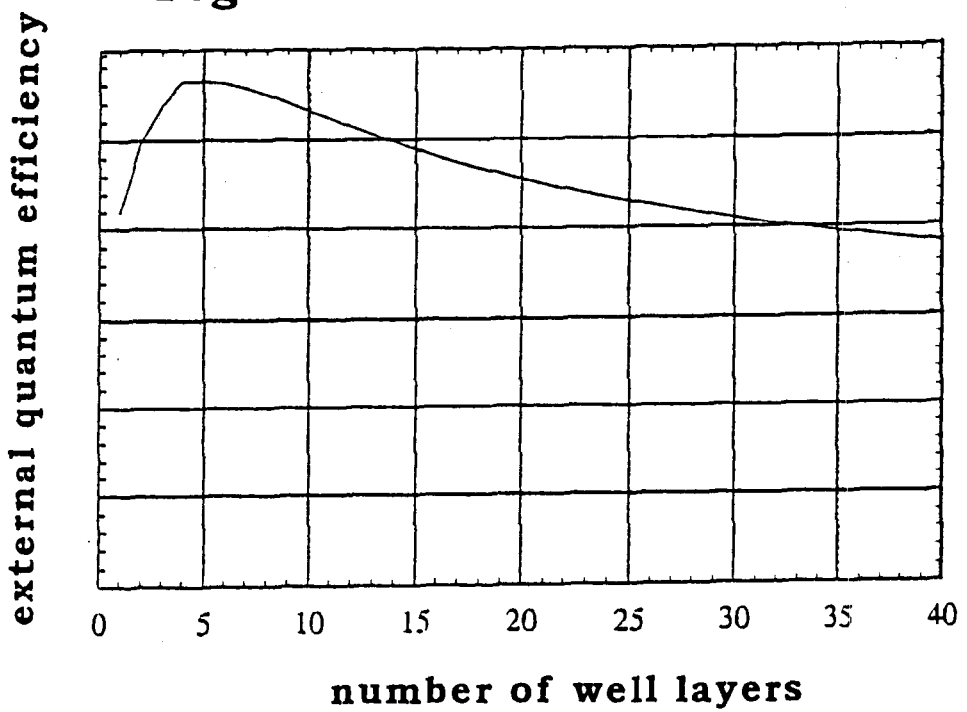
FIG. 6 is a graph for illustrating a relationship between the number of the well layers and external quantum efficiency.

Output is calculated as a sum of light emitted upward and light emitted downward multiplied by the reflectance and the transmissivity, and thus graphed as shown in FIG. 6. The output may vary depending on the reflectance of the reflecting layer, but the active layer including about 3 to 7 well layers shows high output. With the 3 to 7 well layers, the light emitting efficiency and the transmissivity of the active layer are well balanced and the external quantum efficiency improves, which allows manufacture of an LED of high performance.

In particular, the number of the well layers is preferably 4. With the 4 well layers, the light emitting efficiency and the transmissivity of the active layer are best balanced and the external quantum efficiency further improves, which allows manufacture of an LED of high performance.

Another feature of the present invention is to determine a total thickness of the well layers such that the MQW layer shows the external quantum efficiency to the maximum. The light emitting efficiency of the active layer is improved by adjusting the total thickness of the well layers and thus well balanced with the transmissivity of the reflected light, so that the external quantum efficiency improves.

It is considered that results similar to those shown in FIGS. 4 to 6 will be obtained even when the total thickness of the well layers is taken as the horizontal axis. More specifically, the total thickness is preferably 200 to 600 Å. Within the range, the light emitting efficiency and the transmissivity of the active layer are well balanced and the external quantum efficiency improves, which allows manufacture of an LED of high performance.

In particular, the total thickness of the well layers is preferably 320 Å. With this thickness, the light emitting efficiency and the transmissivity are best balanced and the external quantum efficiency further improves, which allows manufacture of an LED of high performance.

It is more preferable that the MQW layer satisfies both of the conditions of the number and the total thickness of the well layers.

In accordance with the present invention, the MQW layer is not particularly limited and made of any known material. In particular, the MQW layer is desirably made of an AlGaInP type material. Alternatively, the MQW layer may be made of a III–V group compound semiconductor material containing nitrogen when formed on a silicon substrate. The AlGaInP type material exhibits the greatest direct transitional bandgap among the III–V group compound semiconductors so that it has been used as a visible light emitting device. Further, it performs a direct transitional light emission in the range of 550 to 690 nm when applied to the light emitting diode, which exhibits a high light emitting efficiency. With use of the III–V group compound semiconductor material containing nitrogen, light emission in the range of ultraviolet to blue is obtained.

More specifically, the MQW layer is preferably made of GaInP well layers and AlGaInP barrier layers which are alternately stacked.

According to the present invention, the reflecting layer is not particularly limited and any known structure and material may be applied.

More specifically, the reflecting layer is preferably a DBR layer made of AlGaInP type materials. Since the material type of DBR layer and the MQW layer are the same, the DBR layer is conveniently formed by easily adjusting flow rates of material gases or switching the gases in a vapor phase growth. For example, the DBR layer may be a layered structure of an AlGaInP layer and an AlInP layer.

The reflecting layer of the present invention may be a DBR layer comprised of multiple layers of AlGaAs type materials having a great difference in refractive index. Accordingly, a reflecting layer of higher reflectance is obtained and the external quantum efficiency is improved. For example, the DBR layer may be a layered structure of an AlGaAs layer and an AlAs layer.

Alternatively, the reflecting layer may be a DBR layer comprised of a layered structure of an AlGaInP type material layer and an AlGaAs type material layer having a great difference in refractive index. Accordingly, a reflecting layer of higher reflectance is obtained and the external quantum efficiency is improved.

Constituents of the light emitting diode other than the MQW layer and the reflecting layer include a substrate, a clad layer, an electric current diffusion layer and electrodes. These are not particularly limited and any structure and material may suitably be selected.

EXAMPLES

Example 1

Figure 1:
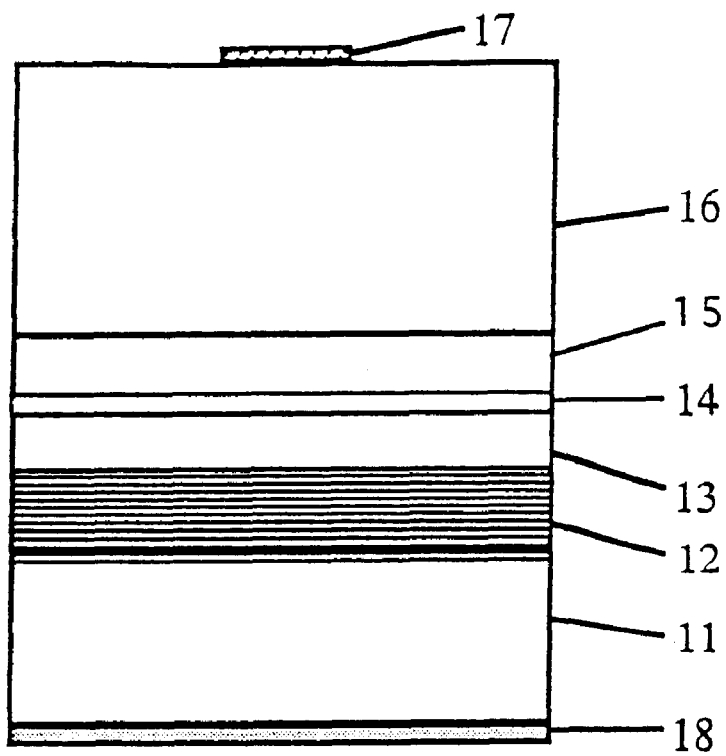
FIG. 1 is a schematic sectional view for illustrating an LED according to Example 1 of the present invention.

A light emitting diode according to Example 1 of the present invention will be described. FIG. 1 shows a sectional view of the light emitting diode of Example 1. The layered structure of the light emitting diode is comprised of:

an n-type GaAs substrate 11;

a DBR layer 12 including 20 X n-type (AlGaAs/AlAs) layers;

an n-type AlInP clad layer 13 of 1 $\mu$m thick;

an MQW layer (active layer) 14 including multiple GaInP well layers each having a thickness of 80 Å and multiple $(Al_{0.5}Ga_{0.5})_{0.5}In_{0.5}P$ barrier layers each having a thickness of 120 Å;

a p-type AlInP clad layer 15 of 1 $\mu$m thick; and a p-type $Ga_{0.9}In_{0.1}P$ electric current diffusion layer 16 of 7 $\mu$m thick.

Electrodes 17 and 18 are formed on a p-side and an n-side, respectively.

Figure 7:
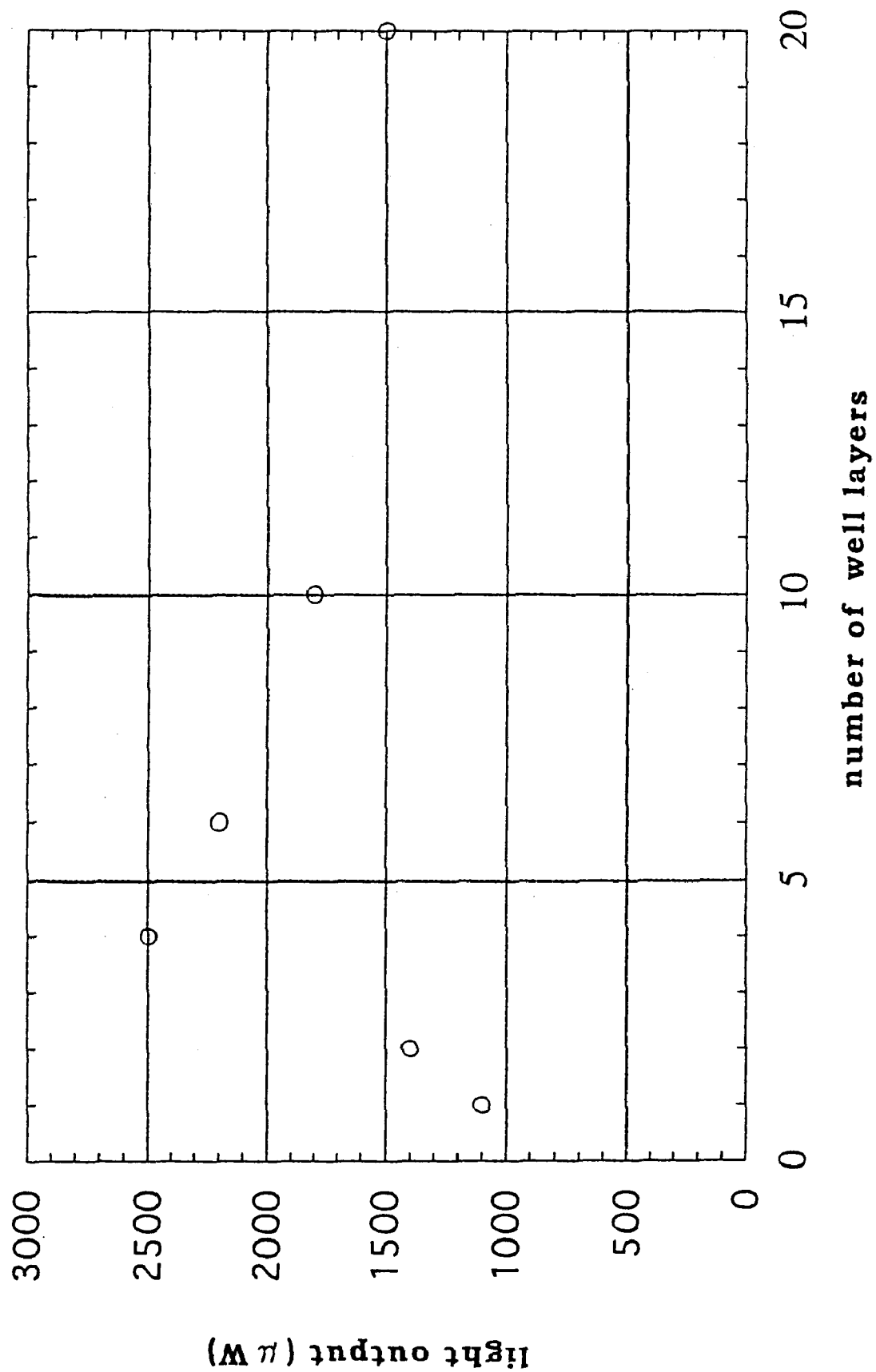
FIG. 7 is a graph for illustrating a relationship between the number of the well layers and light output of the LED of Example 1.

Light emitting diodes in which the number of the well layers in the MQW layer is varied from each other are manufactured and outputs thereof are measured. FIG. 7 shows the results. Favorable output is obtained when the number of the well layers is 3 to 7 and the total thickness of the well layers is 200 to 600 Å. In particular, the maximum output is exhibited when the number of the well layers is 4.

Example 2

Figure 2:
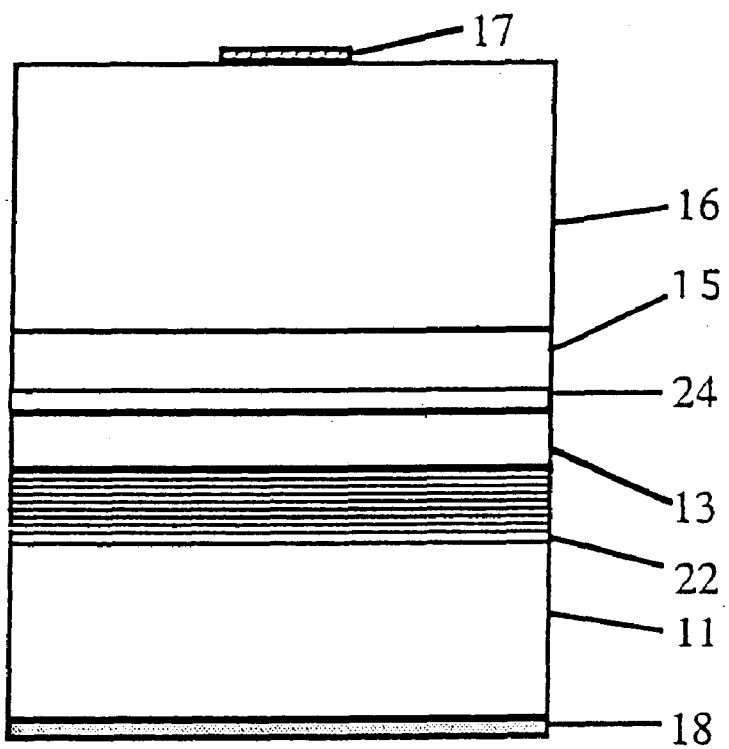
FIG. 2 is a schematic sectional view for illustrating an LED according to Example 2 of the present invention.

A light emitting diode according to Example 2 of the present invention will be described. FIG. 2 shows a sectional view of the light emitting diode of Example 2. The layered structure of the light emitting diode is comprised of:

an n-type GaAs substrate 11;

a DBR layer 22 including 10 X n-type (AlGaInP/AlInP) layers;

an n-type AlInP clad layer 13 of 1 $\mu$m thick;

an MQW layer (active layer) 24 including multiple $(Al_{0.1}Ga_{0.9})_{0.5}In_{0.5}P$ well layers each having a thickness of 50 Å and multiple $(Al_{0.5}Ga_{0.5})_{0.5}In_{0.5}P$ barrier layers each having a thickness of 120 Å;

a p-type AlInP clad layer 15 of 1 $\mu$m thick; and a p-type $Ga_{0.9}In_{0.1}P$ electric current diffusion layer 16 of 7 $\mu$m thick.

Electrodes 17 and 18 are formed on a p-side and an n-side, respectively.

Different from Example 1, the light emitting diode of Example 2 employs the DBR layer formed of the AlGaInP materials. The thus formed DBR layer also shows high reflectance so that the same effect is obtained. Even in the case where the thickness and the composition of the MQW layer are varied to emit light of smaller wavelength, higher output is obtained with the 4 well layers than with the 10 or more well layers.

The present invention is not limited to the above-mentioned two examples. The composition of AlGaInP of the MQW layer may be varied to emit light of various wavelengths.

Further, the DBR layer may be a layered structure of an AlGaAs type material layer and an AlGaInP type material layer.

Example 3

Figure 8:
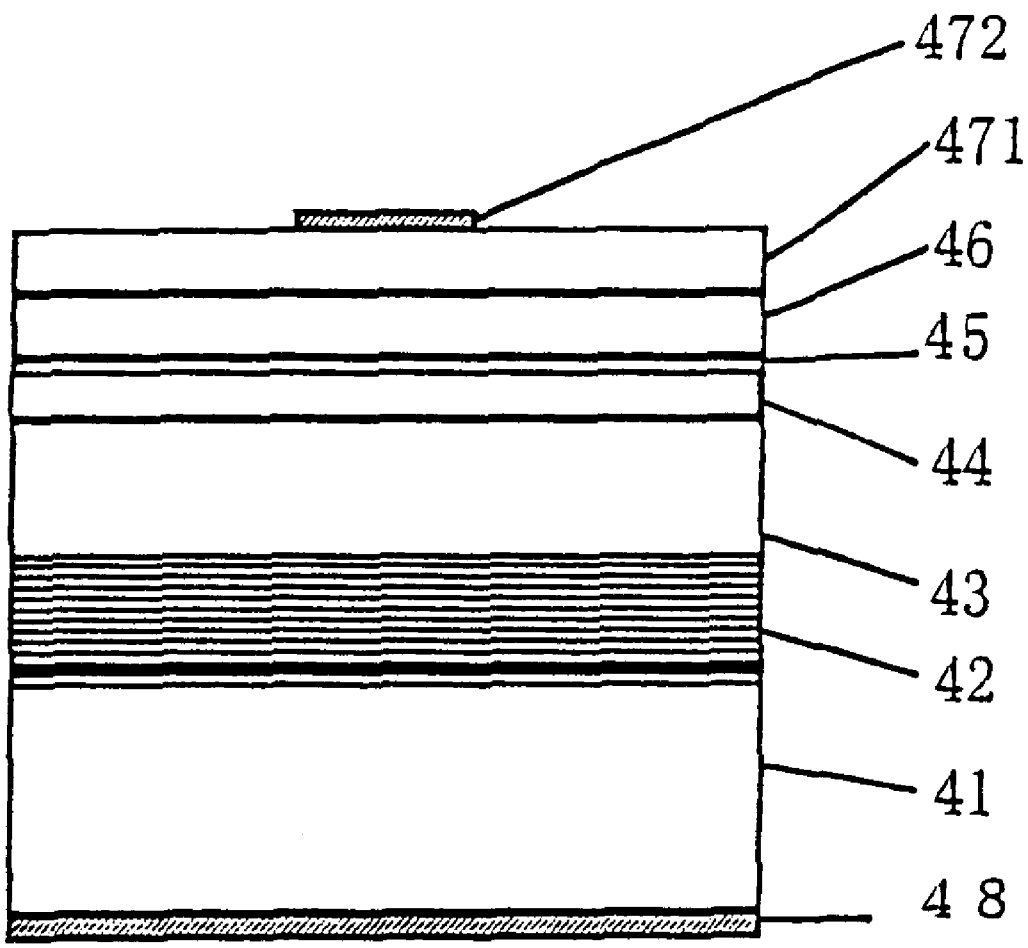
FIG. 8 is a schematic sectional view for illustrating an LED according to Example 3.

A light emitting diode according to Example 3 of the present invention will be described. FIG. 8 shows a sectional view of the light emitting diode of Example 3. The layered structure of the light emitting layer is comprised of:

an n-type silicon substrate 41;

a DBR layer 42 including 20 X n-type (GaN/AlGaN) layers;

an n-type GaN clad layer 43 of 2 $\mu$m thick;

an MQW layer (active layer) 44 including multiple InGaN well layers each having a thickness of 100 Å and multiple InGaN barrier layers each having a thickness of 100 Å;

a p-type AlGaN clad layer 45 of 0.02 $\mu$m thick; and a p-type GaN contact layer 46 of 0.2 $\mu$m thick.

On the p-type GaN contact layer 46, a light transmissive electrode 471 and a bonding pad 472 are formed and an electrode 48 is formed on the n-type silicon substrate.

Different from Examples 1 and 2, the MQW layer is formed of a material containing nitrogen. Accordingly, light emission in the range of ultraviolet to blue is obtained.

Thus, according to the present invention, in the LED comprising the MQW active layer and the reflecting layer below the active layer, the structure of the MQW active layer is optimized to suppress the absorption of light reflected on the reflecting layer for obtaining higher output.

What is claimed is:

1. A light emitting diode comprising:

a multiple quantum well (MQW) layer as an active layer;

a reflecting layer below the active layer, and wherein the number of well layers in the MQW layer is determined such that the MQW layer shows an external quantum efficiency higher than that of an MQW layer including a single well layer and so that the MQW layer shows an external quantum efficiency proximate an apex or peak of a curve representing external quantum efficiency versus number of MQW well layers for the diode with the reflecting layer below the MQW.

2. A light emitting diode according to claim 1, wherein the number of the well layers is determined such that the external quantum efficiency is exhibited to the maximum.

3. A light emitting diode according to claim 2, wherein the number of the well layers is 3 to 7.

4. A light emitting diode according to claim 2, wherein the number of the well layers is 4.

5. A light emitting diode according to claim 1, wherein the MQW layer is comprised of an AlGaInP type material layer.

6. A light emitting diode according to claim 1, wherein the MQW layer is formed on a silicon substrate and comprised of a III–V group compound semiconductor layer containing nitrogen.

7. A light emitting diode according to claim 5, wherein the reflecting layer is a distribution type Bragg reflection (DBR) layer comprising an AlGaInP type material layer, an AlGaAs type material layer or a layered structure of them.

8. The light emitting diode of claim 1, wherein the reflecting layer is formed on a substrate.

9. The light emitting diode of claim 8, wherein the substrate absorbs light.

10. The light emitting diode of claim 9, wherein the substrate comprises a GaAs substrate.

11. A light emitting diode comprising:

an MQW layer as an active layer;

a reflecting layer below the active layer, and wherein a total thickness of well layers in the MQW layer is determined such that the MQW layer shows an external quantum efficiency at an apex or top portion of a bell-shaped curve representing external quantum efficiency versus number and/or total thickness of MQW well layers for the diode with the reflecting layer below the active layer.

12. A light emitting diode according to claim 11, wherein the total thickness of the well layers is 200 to 600 Å.

13. A light emitting diode according to claim 11, wherein the total thickness of the well layers is 320 Å.

14. A light emitting layer according to claim 11, wherein the MQW layer is comprised of an AlGaInP type material layer.

15. A light emitting layer according claim 11, wherein the MQW layer is formed on a silicon substrate and comprised of a III–V group compound semiconductor layer containing nitrogen.

16. A light emitting diode according to claim 11, wherein the reflecting layer is a distribution type Bragg reflection (DBR) layer comprising an AlGaInP type material layer, an AlGaAs type material layer or a layered structure of them.

17. The light emitting diode of claim 11, wherein the reflecting layer is formed on a substrate.

18. The light emitting diode of claim 17, wherein the substrate absorbs light.

19. The light emitting diode of claim 18, wherein the substrate comprises a GaAs substrate.

20. A light emitting diode comprising:

a multiple quantum well (MQW);

a reflecting layer between the MQW and a semiconductor substrate, and wherein the number of well layers in the MQW is determined such that the MQW has an external quantum efficiency at an apex or peak of a curve representing external quantum efficiency versus number of MQW well layers for the diode with the reflecting layer below the MQW.

21. The light emitting diode of claim 20, wherein the number of well layers in the MQW is determined so that the MQW has an external quantum efficiency at the maximum peak of the curve representing external quantum efficiency versus number of MQW well layers for the diode with the reflecting layer below the MQW.

22. A light emitting diode comprising:

a multiple quantum well (MQW), the MQW including a plurality of well layers and a plurality of barrier layers;

a reflecting layer between the MQW and a semiconductor substrate, and wherein the number of well layers in the MQW is from 3 to 7, and a total thickness of the well layers of the MQW is from 200 to 600 Å.

23. The light emitting diode of claim 22, wherein the number of well layers of the MQW and/or the total thickness of the MQW is/are chosen so that the MQW has an external quantum efficiency proximate a peak of a curve representing external quantum efficiency versus number of MQW well layers for the diode with the reflecting layer below the MQW.

* * * * *